(12) United States Patent
Kato et al.

(10) Patent No.: US 11,545,409 B2
(45) Date of Patent: Jan. 3, 2023

(54) SEMICONDUCTOR MODULE HAVING BLOCK ELECTRODE BONDED TO COLLECTOR ELECTRODE AND MANUFACTURING METHOD THEREOF

(71) Applicant: FUJI ELECTRIC CO., LTD., Kawasaki (JP)

(72) Inventors: Ryoichi Kato, Kawasaki (JP); Yoshinari Ikeda, Kawasaki (JP); Tatsuo Nishizawa, Kawasaki (JP); Motohito Hori, Kawasaki (JP); Eiji Mochizuki, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 65 days.

(21) Appl. No.: 17/141,990

(22) Filed: Jan. 5, 2021

(65) Prior Publication Data

US 2021/0242103 A1    Aug. 5, 2021

(30) Foreign Application Priority Data

Feb. 5, 2020    (JP) .............................. JP2020-017649

(51) Int. Cl.
*H01L 23/36* (2006.01)
*H01L 23/00* (2006.01)
(Continued)

(52) U.S. Cl.
CPC .............. *H01L 23/36* (2013.01); *H01L 21/56* (2013.01); *H01L 23/14* (2013.01); *H01L 24/14* (2013.01); *H01L 29/7393* (2013.01)

(58) Field of Classification Search
CPC ........................... H01L 23/36; H01L 29/7393
(Continued)

(56) References Cited

U.S. PATENT DOCUMENTS

2004/0046245 A1* 3/2004 Minervini ............ H04R 31/006
257/704
2007/0210392 A1* 9/2007 Sakakibara ............. B81B 7/007
257/414
(Continued)

FOREIGN PATENT DOCUMENTS

JP         2004228403 A      8/2004
JP         2013077745 A      4/2013
(Continued)

*Primary Examiner* — Quoc D Hoang
(74) *Attorney, Agent, or Firm* — Rabin & Berdo, P.C.

(57) ABSTRACT

A semiconductor module includes a laminated substrate having an insulating plate, a circuit pattern on an upper surface of the insulating plate and a heat dissipating plate on a lower surface of the insulating plate. The module further includes a semiconductor device having upper and lower surfaces, and including a collector electrode on the device upper surface, an emitter electrode and a gate electrode on the device lower surface, and the emitter electrode and the gate electrode each being bonded to an upper surface of the circuit pattern via a bump, and a block electrode bonded to the collector electrode. The block electrode includes a flat plate portion covering over the semiconductor device, and a pair of projecting portions projecting toward the circuit pattern from both ends of the flat plate portion in a thickness direction orthogonal to a surface of the insulating plate, and being bonded to the circuit pattern.

17 Claims, 9 Drawing Sheets

(51) Int. Cl.
*H01L 21/56* (2006.01)
*H01L 29/739* (2006.01)
*H01L 23/14* (2006.01)

(58) Field of Classification Search
USPC .......................................... 257/139, 704, 720
See application file for complete search history.

(56) References Cited

U.S. PATENT DOCUMENTS

| 2013/0092948 | A1 | 4/2013 | Otsuka | |
|---|---|---|---|---|
| 2017/0025344 | A1 | 1/2017 | Kanai | |
| 2021/0050320 | A1* | 2/2021 | Tsai | H01L 25/18 |
| 2021/0242156 | A1* | 8/2021 | Kato | H01L 23/5386 |

FOREIGN PATENT DOCUMENTS

| JP | 2013089948 A | 5/2013 |
|---|---|---|
| JP | 2014107506 A | 6/2014 |
| JP | 3198019 U | 6/2015 |
| JP | 2016009819 A | 1/2016 |
| JP | 2016025237 A | 2/2016 |
| JP | 2017028132 A | 2/2017 |

* cited by examiner

SEMICONDUCTOR MODULE HAVING BLOCK ELECTRODE BONDED TO COLLECTOR ELECTRODE AND MANUFACTURING METHOD THEREOF

CROSS REFERENCE TO RELATED APPLICATIONS

This application is based upon and claims the benefit of priority of the prior Japanese Patent Application No. 2020-017649, filed on Feb. 5, 2020, the entire contents of which are incorporated herein by reference.

TECHNICAL FIELD

The present invention relates to a semiconductor module and a semiconductor module manufacturing method.

BACKGROUND ART

A semiconductor apparatus has a substrate produced with a semiconductor device such as an insulated gate bipolar transistor (IGBT), a power metal oxide semiconductor field effect transistor (MOSFET), or a free wheeling diode (FWD), and is used for an inverter device and the like.

For example, semiconductor apparatuses (semiconductor modules) that are described in Patent Literatures 1 and 2 presented below are each composed of a base plate, an insulating circuit board, and a semiconductor device, and the like arranged within a case. The insulating circuit board includes a first conductive plate (first metal layer) formed on an upper surface of an insulating substrate and a second conductive plate (second metal layer) formed on a lower surface of the insulating substrate. On an upper surface of the first conductive plate, the semiconductor device is arranged; and on a lower surface of the second conductive plate, a base plate is arranged. In addition, as an electrical wiring member between the semiconductor device and the first conductive plate or another semiconductor device, wire (bonding wire) is used.

An internal space of the case is filled with a sealing material (sealing resin), so that the various configurations described above are sealed. In addition, a cooler is arranged on a lower surface of the base plate via a bonding material such as solder.

CITATION LIST

Patent Literature

[Patent Literature 1] Japanese Patent Laid-Open No. 2017-28132
[Patent Literature 2] Japanese Utility Model Registration No. 3198019

SUMMARY OF INVENTION

Problems to be Solved by the Invention

In a heat dissipation structure of the conventional semiconductor modules, the heat of a chip (semiconductor device) is dissipated into air via a cooler so as to reduce heat generation in the chip. In addition, the chip generates heat mainly on an emitter electrode side that is a front surface side. Therefore, the heat generated by the chip is transferred to a rear surface side (collector electrode side) and is discharged to the outside through the insulating circuit substrate, the base plate, the bonding material, and cooler As described above, the chip generates heat on the emitter electrode side and therefore, it is necessary to transfer the heat generated on the emitter electrode side to the collector electrode side that is a side of the cooler. This causes a problem in which the thermal resistance of the entire semiconductor module is increased with the thermal conductivity and thickness of the chip. In addition, another problem in the conventional semiconductor modules is that since a wire is used to make wiring of a gate electrode side and the emitter electrode side, a wiring length has to be long and this results in an increase in inductance.

The present invention has been made in view of the above points, and it is an object of the present invention to provide a semiconductor module and a semiconductor module manufacturing method that can reduce thermal resistance and also can reduce inductance.

Means for Solving the Problems

A semiconductor module in one aspect of the present invention is characterized by including: a laminated substrate including a circuit pattern arranged on an upper surface of an insulating plate and a heat dissipating plate arranged on a lower surface of the insulating plate; a semiconductor device that has a collector electrode arranged on an upper surface thereof, has an emitter electrode and a gate electrode arranged on a lower surface thereof, and has the emitter electrode and the gate electrode each bonded to an upper surface of the circuit pattern via a bump; and a block electrode that is bonded to the collector electrode. The block electrode includes: a flat plate portion that covers over the semiconductor device; and a pair of projecting portions that projects from both ends of the flat plate portion toward the circuit pattern and is bonded to the circuit pattern.

A semiconductor module manufacturing method in one aspect of the present invention is characterized by performing: a preparation step of preparing a laminated substrate including a circuit pattern arranged on an upper surface of an insulating plate and a heat dissipating plate arranged on a lower surface of the insulating plate, and a block electrode including both a flat plate portion covering over a semiconductor device and a pair of projecting portions projecting from both ends of the flat plate portion toward the circuit pattern; a chip arrangement step of arranging the semiconductor device with a collector electrode thereof directed toward a lower surface of the flat plate portion; and a block electrode arrangement step of bonding, after the chip arrangement step, an emitter electrode arranged on a lower surface of the semiconductor device to the circuit pattern on the insulating plate via a bump and also bonding the pair of projecting portions to the circuit pattern.

Advantageous Effects of Invention

According to the present invention, thermal resistance can be reduced and also inductance can be reduced.

MODE FOR CARRYING OUT THE INVENTION

Figure 1:
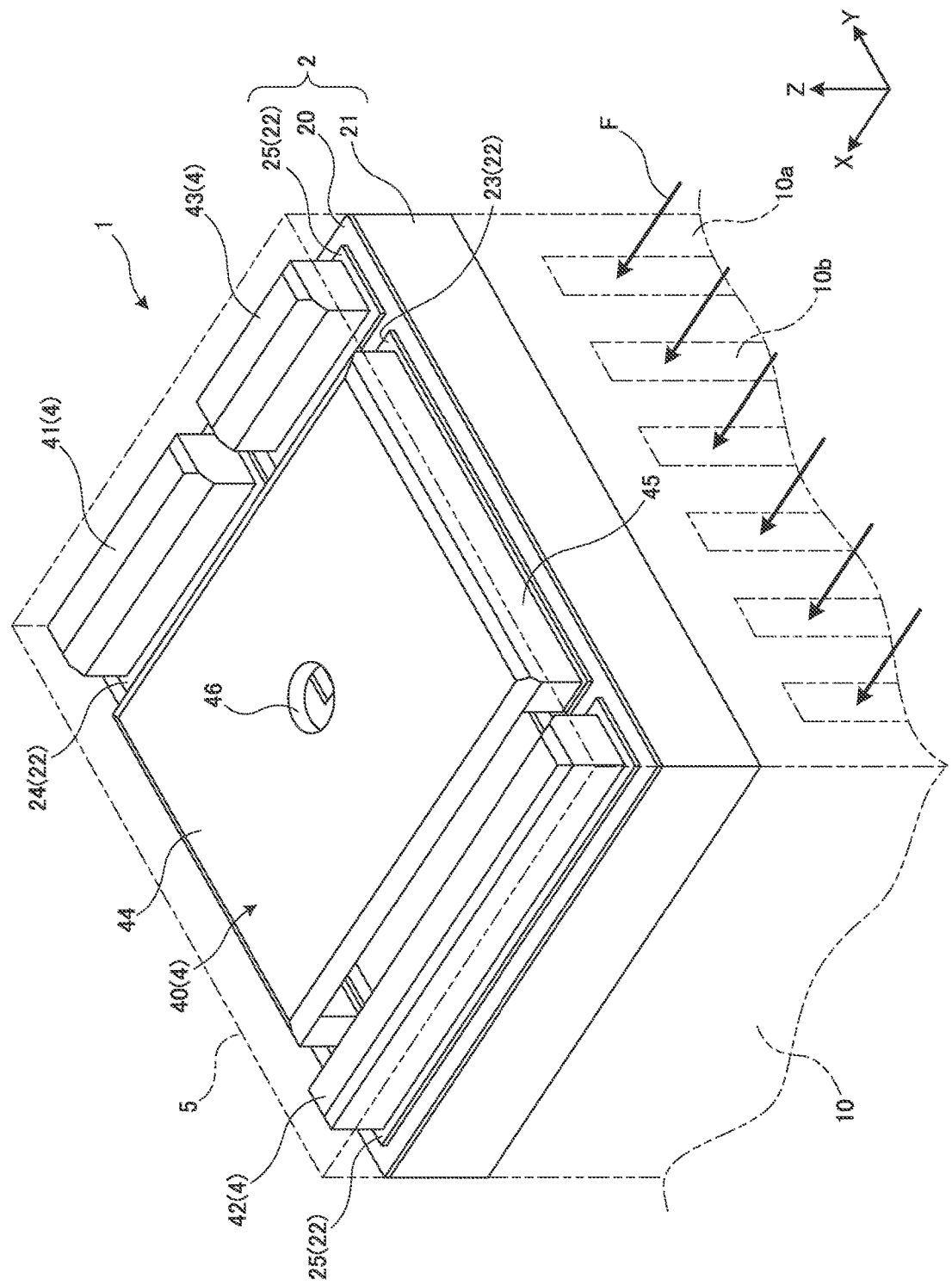
FIG. 1 is a perspective view of a semiconductor module according a present embodiment.
Figure 2:
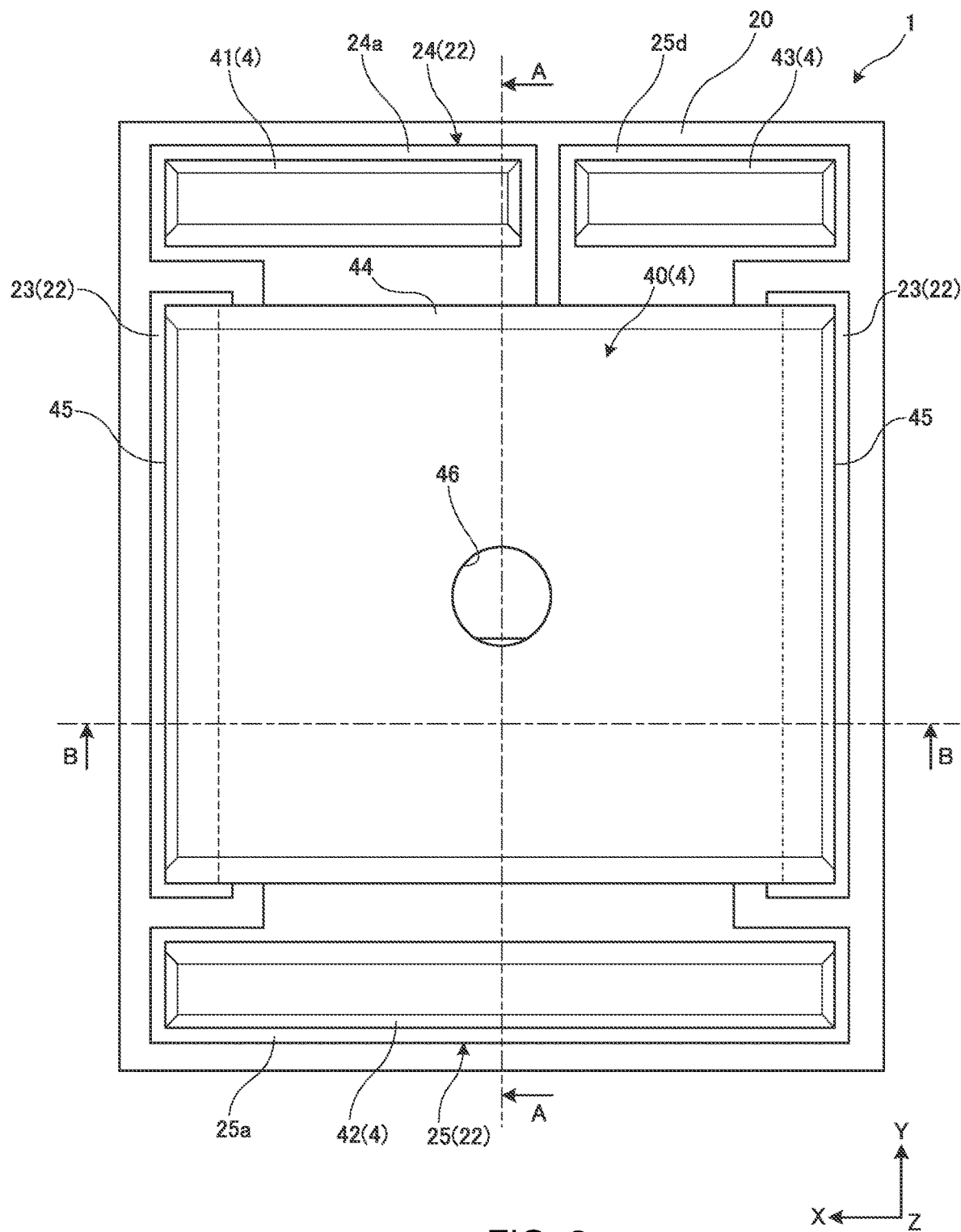
FIG. 2 is a plan view of the semiconductor module according the present embodiment.
Figure 3:
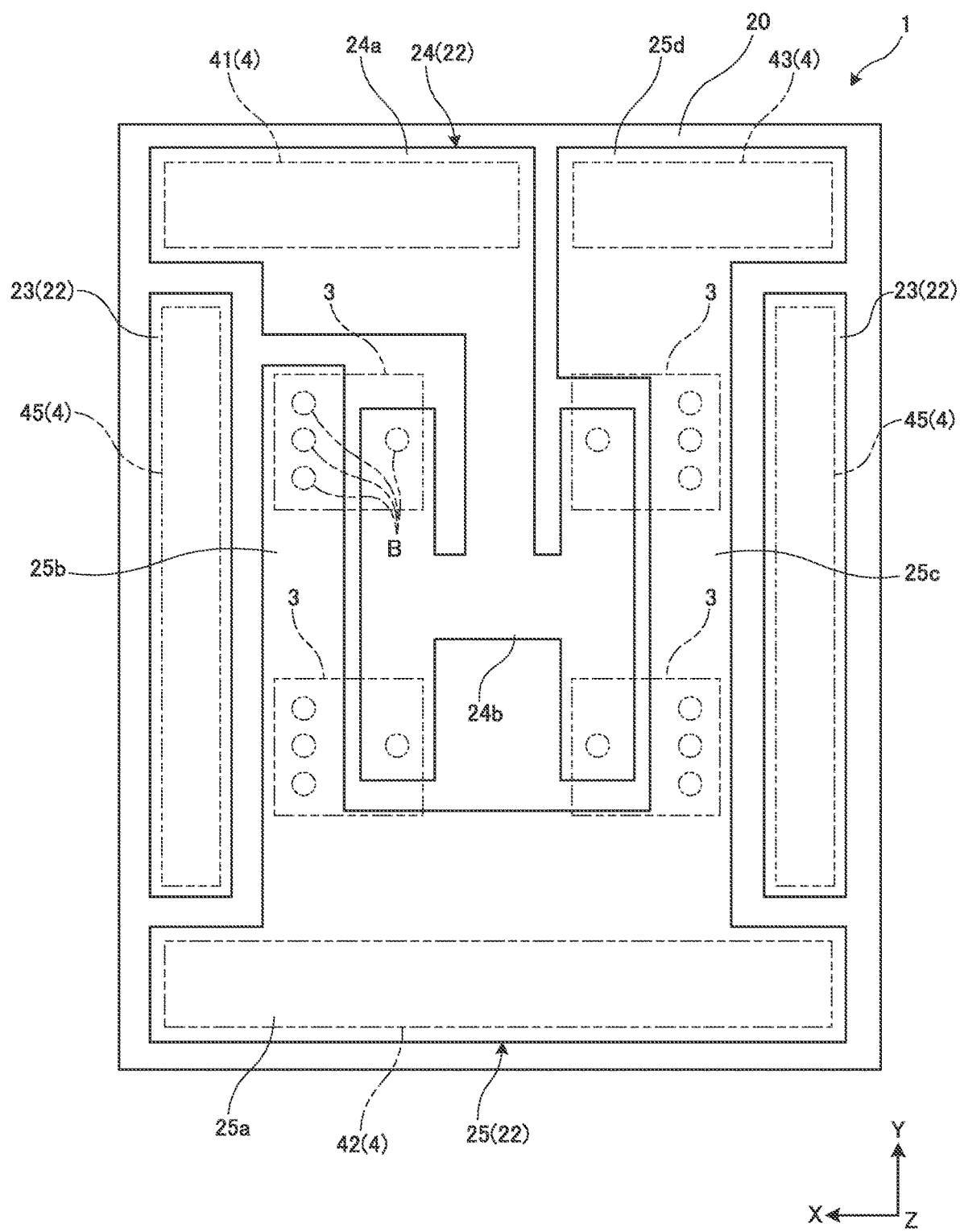
FIG. 3 is a plan view showing a circuit pattern of the semiconductor module according the present embodiment.
Figure 4A:
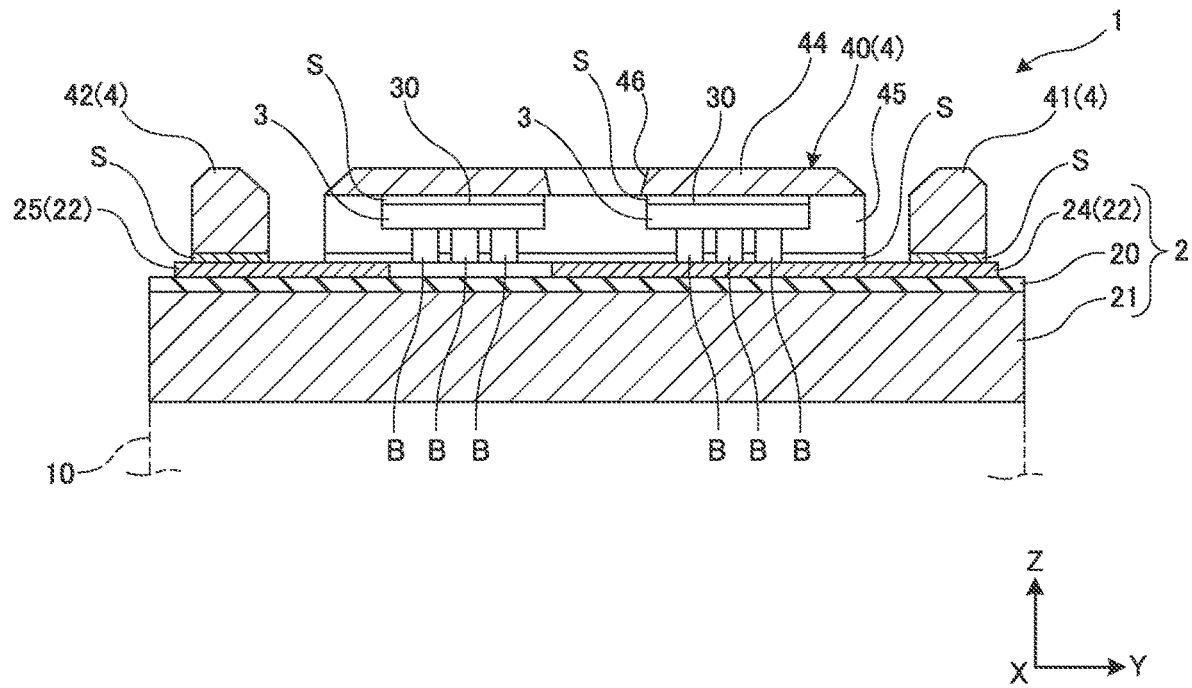
FIG. 4A and FIG. 4B are cross-sectional views of the semiconductor module according the present embodiment.
Figure 4B:
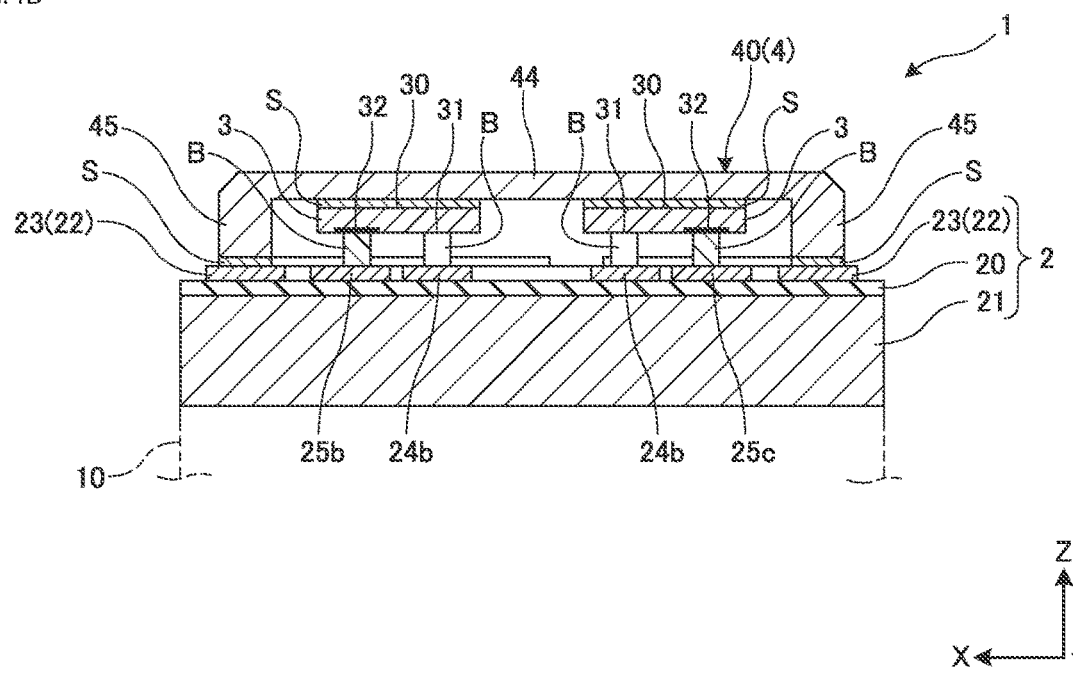
Figure 5A:
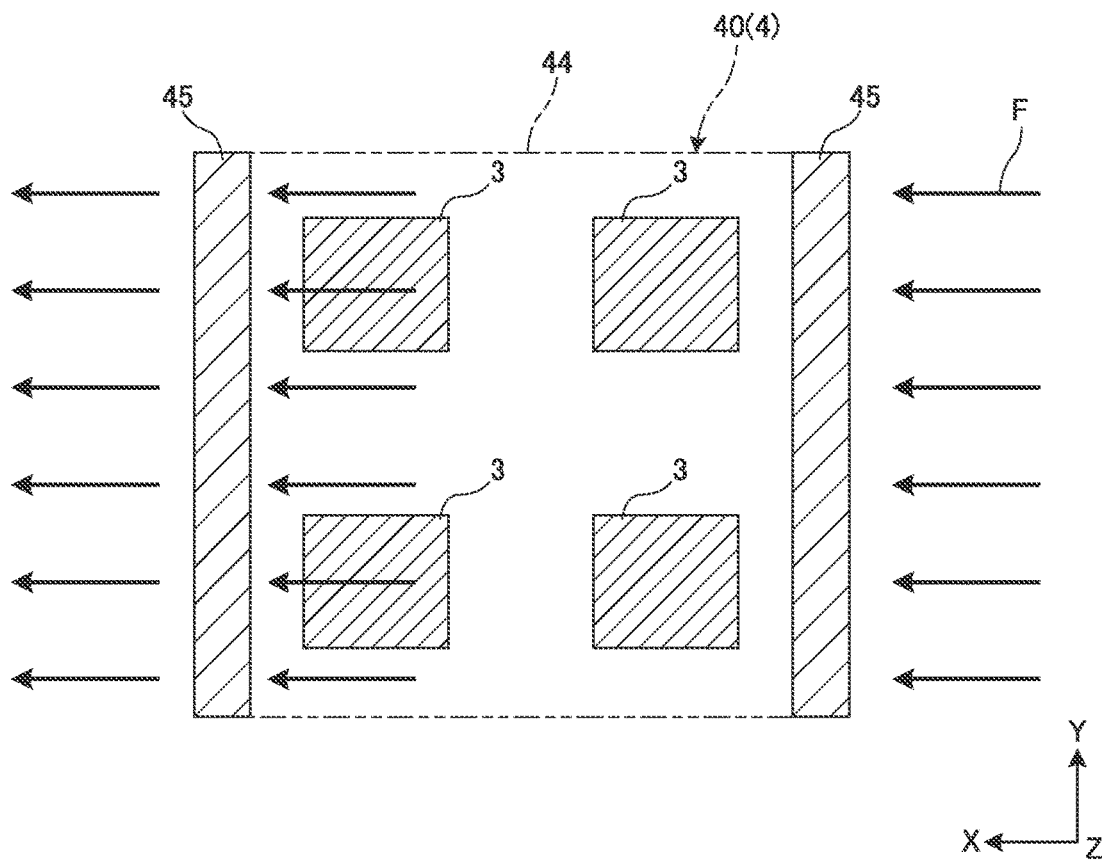
FIG. 5A and FIG. 5B are schematic views showing the flow of a coolant in the semiconductor module according the present embodiment.
Figure 5B:
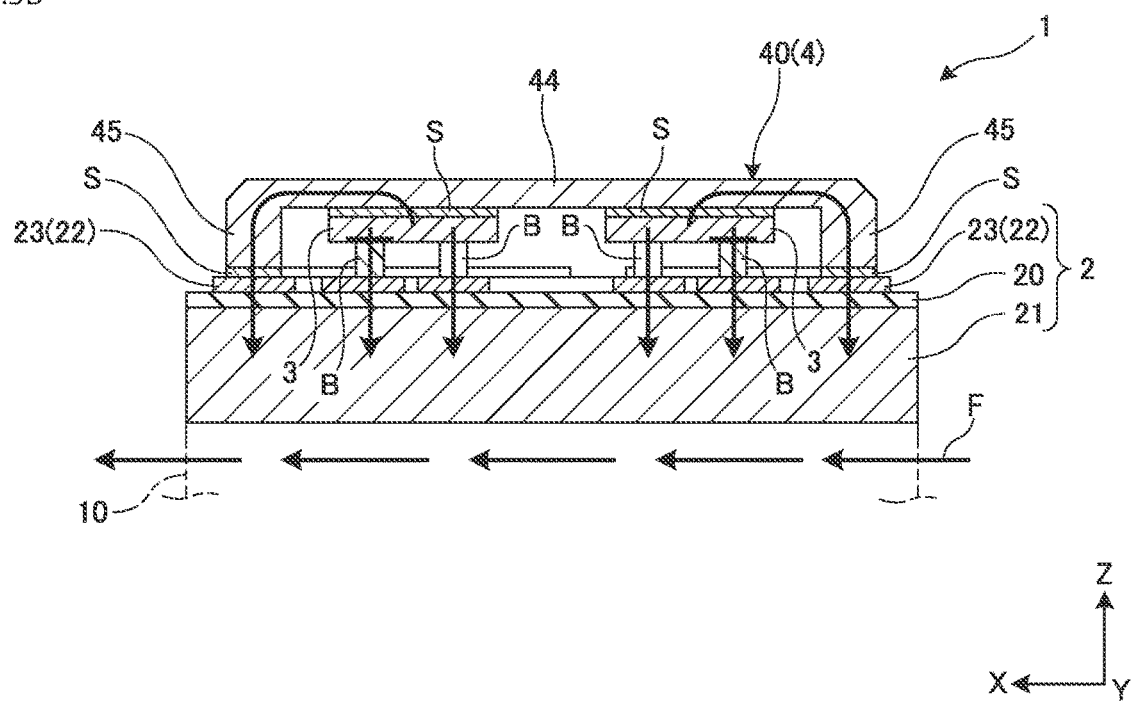

Hereinafter, a semiconductor module to which the present invention is applicable will be described. FIG. 1 is a perspective view of a semiconductor module according an embodiment. FIG. 2 is a plan view of the semiconductor module according the present embodiment. FIG. 3 is a plan view showing a circuit pattern of the semiconductor module according the present embodiment. FIG. 4 is cross-sectional views of the semiconductor module according the present embodiment. FIG. 4A is a cross-sectional view taken along line A-A in FIG. 2; and FIG. 4B is a cross-sectional view taken along line B-B in FIG. 2. FIG. 5 is a schematic view showing the flow of a coolant in the semiconductor module according the present embodiment. FIG. 5A is a schematic plan view of the semiconductor module; and FIG. 5B is a schematic cross-sectional view of the semiconductor module. Note that the semiconductor module presented below is merely an example and can be modified as appropriate without being limited thereto.

In addition, it is defined that in figures described below, a short direction of the semiconductor module is an X direction, a longitudinal direction is a Y direction, and a height direction is a Z direction. Furthermore, the X direction, the Y direction, and the Z direction may be referred to as a left-right direction, a front-back direction, and an up-down direction, respectively. These directions (front-back, left-right, and up-down directions) are terms used for convenience of explanation, and correspondence to each of the X, Y, and Z directions may change depending on the mounting position of the semiconductor module. For example, a heat dissipation surface side (cooler side) of the semiconductor module is considered as a lower surface side and its opposite side is referred to as an upper surface side. In addition, herein, a plan view refers to viewing an upper surface of the semiconductor module from the Z direction.

A semiconductor module 1 is applied, for example, to a power converter such as a power module. As shown in FIG. 1 to FIG. 4, the semiconductor module 1 is constituted by arranging a plurality of semiconductor devices 3 and a plurality of block electrodes 4 on an upper surface of a laminated substrate 2.

The laminated substrate 2 is formed by laminating a metal layer and an insulating layer and, for example, is constituted by a direct copper bonding (DCB) substrate, an active metal brazing (AMB) substrate, or a metal-based substrate. Specifically, the laminated substrate 2 includes: an insulating plate 20, a heat dissipating plate 21 arranged on a lower surface of the insulating plate 20; and a plurality of circuit patterns 22 arranged on an upper surface of the insulating plate 20. In addition, the laminated substrate 2 is formed into a rectangular shape in a plan view in which length in the Y direction is longer than in the X direction.

The insulating plate 20 has a thickness in the Z direction and is formed into a flat-plate shape having an upper surface and a lower surface. The insulating plate 20 is formed of, for example, a ceramic material such as alumina ($Al_2O_3$), aluminum nitride (AlN), or silicon nitride ($Si_3N_4$), a resin material such as epoxy, or an insulating material such as an epoxy resin material using a ceramic material as a filler. Note that the insulating plate 20 may be referred to as an insulating layer or an insulating film.

The heat dissipating plate 21 has a predetermined thickness and is formed so as to cover the entire lower surface of the insulating plate 20. The heat dissipating plate 21 is made of a metal plate having good thermal conductivity, such as copper or aluminum, for example. The lower surface of the heat dissipating plate 21 is a heat dissipation surface, and on the heat dissipation surface, a cooler 10 is mounted.

The cooler 10 is constituted of, for example, a heat sink and has a rectangular shape in a plan view. The cooler 10 is made of metal such as copper or aluminum, or an alloy containing one or more of them; and on its surface, a plating treatment has been performed, for example. The cooler 10 is mounted on the semiconductor module 1 via, for example, a compound having good thermal conductivity between itself and the lower surface of the semiconductor module 1 (heat dissipating plate 21). An upper surface of the cooler 10 is a smooth bonding surface to which the lower surface of the semiconductor module 1 is bonded. On a side of the lower surface of the cooler, a plurality of fins 10a projecting in the Z direction are formed.

The plurality of fins 10a are arranged in a row at intervals in the Y direction. This forms a groove 10b between adjacent fins 10a. A coolant such as air flows through the groove 10b, thereby achieving cooling of the semiconductor module 1. Although the details will be described later, a direction in which the coolant flows (flow direction) is referred to as a cooling direction F. Note that the cooler 10 is not limited to the configuration described above and may be constituted by a water-cooling type cooler provided with a water jacket.

As shown in FIG. 3, a main surface of the insulating plate 20 has a plurality of (four, in the present embodiment) circuit patterns 22 insularly (in a mutually electrically insulating state) formed. The plurality of circuit patterns 22 include: a pair of collector circuit patterns 23 connected to a collector electrode 30 of each of the semiconductor devices 3 described later; a gate circuit pattern 24 connected to a gate electrode 31 thereof; and an emitter circuit pattern 25 connected to an emitter electrode 32 thereof.

The collector circuit patterns 23 each has a long shape in a plan view, extending in a longitudinal direction (Y direction) of the insulating plate 20 on an outer periphery side of the insulating plate 20. The pair of collector circuit patterns 23 are arranged so as to face each other in a short direction (X direction) of the insulating plate 20.

The gate circuit pattern 24 bends in an L shape from an end portion on one side in the longitudinal direction of the insulating plate 20 toward the center thereof and has a shape of being divided into four branches from the center of the insulating plate 20. Specifically, the gate circuit pattern 24 is constituted by connecting an L portion 24a of an L shape in a plan view and an H portion 24b of an H shape in a plan view. The L portion 24a extends in the X direction from one corner portion of the insulating plate 20, bends perpendicularly at an approximate middle portion in the X direction of the insulating plate 20, and extends to a midsection (center) of the insulating plate 20. The H portion 24b is formed by connecting midsections of a pair of long portions extending in the Y direction with a long portion extending in the X direction. The H portion 24b is arranged in the midsection of the insulating plate 20. The midsection of the H portion 24b and an end portion on a side of the midsection of the L portion 24a are connected. Note that although the details will be described later, the H portion 24b constitutes a region where the gate electrode 31 is bonded via a bump B, in a midsection of the insulating plate 20.

The emitter circuit pattern 25 is formed in an approximate U shape in a plan view so as to surround an outer periphery side of the H portion 24b. Specifically, the emitter circuit pattern 25 includes: an emitter portion 25a extending in the X direction along a short side on the other side in the longitudinal direction of the insulating plate 20; a pair of long portions 25b and 25c extending in the Y direction from the emitter portion 25a; and a sense emitter portion 25d connected to one of the long portion 25c.

The pair of long portions 25b and 25c is connected to the emitter portion 25a at their one ends, and sides of the other ends extend along the Y direction. The pair of long portions 25b and 25c are arranged so as to face each other so that they sandwich the H portion 24b in the X direction. The long portions 25b and 25c are arranged so as to be sandwiched between each of the collector circuit patterns 23 and the H portion 24b. The pair of collector circuit patterns 23, the pair of long portions 25b and 25c, and the pair of long portions of the H portion 24b extend in parallel in the Y direction. The sense emitter portion 25d is arranged on an opposite side of the emitter portion 25a so as to sandwich one of the collector circuit patterns 23 with the emitter portion 25a. In addition, the sense emitter portion 25d is arranged side by side with the L portion 24a of the gate circuit pattern 24 in the X direction and extends in the X direction. The sense emitter portion 25d is connected to the one long portion 25c. Note that although the details will be described later, the emitter portion 25a constitutes a region where the emitter electrodes 32 are bonded via bumps B, outside the H portion 24b.

In the circuit patterns 22 thus configured, as shown in FIG. 3, the H portion 24b of the gate circuit pattern 24 is sandwiched between the pair of long portions 25b and 25c. In addition, the H portion 24b and the pair of long portions 25b and 25c are sandwiched between the pair of collector circuit patterns 23. Note that chain double-dashed line portions in FIG. 3 represent areas where the block electrodes 4 or semiconductor devices 3, which are described below, are bonded.

At predetermined positions on the circuit patterns 22, a plurality of the semiconductor devices 3 are arranged. Each of the semiconductor devices 3 is formed into a square shape in a plan view by a semiconductor substrate such as silicon (Si) or silicon carbonate (SiC), for example. In the present embodiment, the semiconductor device 3 is constituted by a reverse-conducting-insulated gate bipolar transistor (RC-IGBT) device in which functions of an IGBT device and a free wheeling diode (FWD) device are integrated.

Note that the semiconductor device 3 is not limited to this and may be constituted by combining a switching device such as an IGBT or power metal oxide semiconductor field effect transistor (MOSFET) and a diode such as a free wheeling diode (FWD). In addition, a reverse blocking (RB)-IGBT or the like having a sufficient withstand voltage against a reverse bias may be used as the semiconductor device 3. Furthermore, the shape, number of arrangements, and arrangement positions of the semiconductor devices 3 can be changed as appropriate.

In the present embodiment, four pieces of the semiconductor devices 3 are arranged, via a plurality of bumps B, on upper surfaces of the H portion 24b and the pair of long portions 25b and 25c. Specifically, the semiconductor devices 3 are arranged so as to straddle above ends of the branched H portion 24b and ends or base ends of the long portions 25b and 25c. On an upper surface of each of the semiconductor devices 3, the collector electrode 30 is arranged; and on a lower surface of each of the semiconductor devices 3, the gate electrode 31 and the emitter electrode 32 are arranged. In the center of one end side of the semiconductor device 3, the gate electrode 31 is arranged; and on another end side opposed thereto, the emitter electrode 32 is arranged.

The semiconductor device 3 is bonded to its corresponding circuit pattern 22 via bumps B by arranging the gate electrode 31 so as to face an upper surface of a corresponding end of the H portion 24b and arranging the emitter electrode 32 so as to face an upper surface of the long portion 25b or 25c. More specifically, the gate electrode 31 is electrically bonded to the upper surface of the corresponding end of the branched H portion 24b, via one bump B for each of the semiconductor devices 3. In addition, the emitter electrode 32 is electrically bonded to the upper surface of the long portion 25b or 25c via three bumps B for each of the semiconductor devices 3.

As described above, the gate electrode 31 and the emitter electrode 32 are arranged side by side in the X direction. Especially, the gate electrode 31 is arranged more inward in the X direction than the emitter electrode 32. That is, four pieces of the gate electrodes 31 are arranged closer to a side of the center of the entire module than four pieces of the emitter electrodes 32.

For the bumps B, a paste-like metal sintered material can be used. For example, a silver or other metal nanoparticle sintered material can be used as the bumps B. The bumps B are formed in a columnar shape extending in a thickness direction (Z direction), for example. Note that the bumps B may be made of solder, not limited to the metal sintered material.

In addition, to the circuit patterns 22, the block electrodes 4 are bonded. Specifically, the block electrodes 4 include: a collector electrode block 40 bonded to the collector circuit pattern 23; a gate electrode block 41 bonded to the gate circuit pattern 24; and an emitter electrode block 42 and a sense emitter electrode block 43 both bonded to the emitter circuit pattern 25.

The collector electrode block 40 is formed into an approximately square shape in a plan view so as to cover the most part above the laminated substrate 2. Specifically, the collector electrode block 40 includes: a flat plate portion 44 covering a part above the semiconductor devices 3; and a pair of projecting portions 45 projecting from both ends in the X direction of the flat plate portion 44 toward the collector circuit patterns 23. Thus, the collector electrode block 40 forms an approximate U shape when viewed from the Y direction.

The flat plate portion 44 is formed into an approximate square shape in a plan view so as to cover a part above: the pair of collector circuit patterns 23; the pair of long portions 25b and 25c and the H portion 24b which are arranged between the pair of collector circuit patterns 23; and the four semiconductor devices 3. The width in the X direction of the flat plate portion 44 corresponds to a facing distance of the pair of collector circuit patterns 23. The width in the Y direction of the flat plate portion 44 corresponds to the length in the Y direction of the collector circuit patterns 23. In addition, at the center of the flat plate portion 44, a circular through hole 46 that penetrates in the thickness direction is formed.

Each of the projecting portions 45 has an approximate rectangular cuboid shape that projects downward in the Z direction from each end portion in the X direction of the flat plate portion 44. The width in the X direction of the projecting portion 45 is slightly smaller than the width of the collector circuit patterns 23. In addition, the width in the Y direction of the projecting portions 45 corresponds to the width of the flat plate portion 44; and is slightly smaller than the width of the collector circuit pattern 23. Furthermore, at each corner portion on an upper surface side of the collector electrode block 40, a chamfer is formed. The pair of projecting portions 45 are arranged along two opposing sides of the insulating plate 20.

On a lower surface of the flat plate portion 44, the collector electrodes 30 of the semiconductor devices 3 are electrically bonded via a bonding material S. In addition, a lower surface of each of the projecting portions 45 is electrically bonded to each of the collector circuit patterns 23 via the bonding material S. As the bonding material S, a sheet-like metal sintered material can be used. For example, it is possible that a silver or other metal nanoparticle sintered material is formed into a sheet shape and is used as the bonding material S. The bonding material S is formed into a rectangular shape with a predetermined thickness, for example. Note that the bonding material S may be constituted by solder, not limited to the metal sintered material. In addition, the bonding material S may be formed in a paste-like state, not limited to a sheet-like state. Furthermore, the height in the Z direction of the projecting portions 45 preferably corresponds to the height obtained by adding the thickness of the semiconductor devices 3 and the height of the bumps B.

The gate electrode block 41 has a rectangular cuboid shape which is longer in the X direction. Specifically, the width in the X direction of the gate electrode block 41 corresponds to the width of the long portion in the X direction of the L portion 24a. The width in the Y direction of the gate electrode block 41 is slightly smaller than the width of the L portion 24a. Furthermore, at each corner portion on the upper surface side of the collector electrode block 40, a chamfer is formed. A lower surface of the gate electrode block 41 is electrically bonded to an upper surface of the long portion in the X direction of the L portion 24a, via the bonding material S.

The emitter electrode block 42 has a rectangular cuboid shape extending in the X direction along the short side on the other side of the longitudinal direction of the insulating plate 20. Specifically, the widths in the X direction and Y direction of the emitter electrode block 42 are slightly smaller than the corresponding widths of the emitter portion 25a. In addition, at each corner portion on an upper surface side of the emitter electrode block 42, a chamfer is formed. A lower surface of the emitter electrode block 42 is electrically bonded to an upper surface of the emitter portion 25a via the bonding material S. The emitter electrode block 42 is arranged outside the collector electrode block 40 (flat plate portion 44) in a plan view.

The sense emitter electrode block 43 has a rectangular cuboid shape which is longer in the X direction. Specifically, the widths in the X direction and Y direction of the sense emitter electrode block 43 are slightly smaller than the corresponding widths of the sense emitter portion 25d. Furthermore, at each corner portion on the upper surface side of the collector electrode block 40, a chamfer is formed. A lower surface of the sense emitter electrode block 43 is electrically bonded to an upper surface of the sense emitter portion 25d via the bonding material S. The sense emitter electrode block 43 is arranged outside the collector electrode block 40 (flat plate portion 44) in a plan view. The sense emitter electrode block 43 is arranged side by side with the gate electrode block 41 in the X direction. In addition, the length in the X direction of the sense emitter electrode block 43 is shorter than the length of the gate electrode block 41.

The block electrodes 4 thus configured are set so as to have the same height in the Z direction. In addition, the block electrodes 4 are preferably made of a metal material having good thermal conductivity, such as copper or aluminum. Furthermore, the collector electrode block 40 may be formed so as to have the flat plate portion 44 and the pair of projecting portions 45 integrated; or may be formed by bonding the flat plate portion 44 and the pair of projecting portions 45 by welding or the like.

In addition, a space above the laminated substrate 2 is filled with a sealing resin 5 (see FIG. 1). The sealing resin 5 is filled, for example, from the through hole 46, to seal the semiconductor devices 3, the laminated substrate 2, and the block electrodes 4. As the sealing resin 5, an epoxy resin or silicone gel can be used.

In a conventional semiconductor module, a semiconductor device is arranged on an upper surface of a laminated substrate. An emitter electrode is arranged on an upper surface of the semiconductor device; and a collector electrode is arranged on a lower surface of the semiconductor device. An emitter electrode and a circuit pattern of the laminated substrate are electrically bonded by bonding wire, for example. In addition, a cooler is arranged on a lower surface of the laminated substrate.

In the conventional configuration, heat generated by the emitter electrode is discharged to the outside through the cooler. In this case, the emitter electrode is on a front surface side of the semiconductor device and therefore, the generated heat is transferred to a rear surface side (collector electrode side) of the semiconductor device and is discharged to the outside through the laminated substrate and the cooler.

As described above, the semiconductor device generates heat on a side of the emitter electrode and therefore, it is necessary to transfer the heat generated on the emitter electrode side to the collector electrode side that is a side of the cooler. This causes a problem in which the thermal resistance of the entire module is increased according to the thermal conductivity and thickness of the semiconductor device. In addition, there is another problem that, as described above, since wiring of the emitter electrode is conventionally performed by bonding wire, a wiring length has to be long and this results in an increase in inductance.

Then, the inventors have focused attention on the direction of an emitter electrode that is a heat generation source of a semiconductor device and have conceived the present invention. That is, the gist of the present invention is to reverse a bonding direction of the semiconductor devices 3 from the conventional one and arrange the emitter electrodes 32 so as to face a side of the laminated substrate 2. Specifically, in the present embodiment, the semiconductor devices 3 are arranged on an upper surface of the laminated substrate 2. On the upper surface of each of the semiconductor devices 3, the collector electrode 30 is arranged; and on a lower surface of the semiconductor device 3, the emitter electrode 32 is arranged. The emitter electrode 32 is bonded to a corresponding circuit pattern 22 on the laminated substrate 2 via bumps B.

In addition, to the collector electrode 30 on an upper surface side of the semiconductor device 3, the block electrode 4 (collector electrode block 40) is bonded. The collector electrode block 40 includes: the flat plate portion 44 covering a part above the semiconductor devices 3; and the projecting portions 45 projecting from both ends of the flat plate portion 44 toward corresponding circuit patterns 22. The projecting portions 45 are bonded to the circuit patterns 22.

According to this configuration, the emitter electrode 32 is faced to the laminated substrate 2 side and is bonded to the laminated substrate 2 via bumps B and therefore, heat generated by the emitter electrode 32 can be directly transferred to the laminated substrate 2 (heat dissipating plate 21) via the bumps B without going through an inside of the semiconductor device. This reduces a thermal resistance, thereby allowing a cooling efficiency to be enhanced. The reduction of the thermal resistance allows a module size to be brought close to a chip size, thereby achieving miniaturization of the entire module. In addition, the wiring of the emitter electrode 32 with bumps B can reduce the wiring length in comparison with conventional bonding wire and can also reduce inductance.

Furthermore, electrical connection of the collector electrodes 30 by the collector electrode block 40 eliminates unnecessary wiring and allows heat of the semiconductor devices 3 to be transferred to the laminated substrate 2 via the collector electrode block 40. That is, the collector electrode block 40 can be used as not only an electrical bonding material but also a heat transfer material. This allows the cooling efficiency to be further enhanced. Yet furthermore, a use of a lot of the metal block electrodes 4 having high heat capacity allows a module having high transient thermal characteristics and short-circuit withstanding capability to be provided.

In the present embodiment, a direction in which the pair of projecting portions 45 face each other in the collector electrode block 40 preferably corresponds to a direction in which a coolant flows (cooling direction F) within a range corresponding to that of the collector electrode block 40 in the cooler 10 mounted on the lower surface of the semiconductor module 1. The direction in which the coolant flows may be, for example, in parallel with the grooves 10b in the cooler 10 which includes the plurality of fins 10a having the grooves 10b formed in one direction (X direction) as shown in FIG. 1. In addition, in the cooler 10 constituted by a water cooling jacket, for example, a direction in which a liquid flows within the water cooling jacket may correspond to a direction in which the pair of projecting portions 45 face each other.

Specifically, as shown in FIG. 5A, the pair of projecting portions 45 each have a rectangular cuboid shape which is longer in the Y direction, and faces each other in the X direction. In this case, the direction in which the coolant flows in the cooler 10 (cooling direction F) is preferably toward the X direction. According to this configuration, as shown in FIG. 5B, the coolant flows from a part below one of the projecting portions 45 toward a part below the other of the projecting portions 45 through a part below the flat plate portion 44. The coolant thus flows in a direction perpendicular to a longitudinal direction (long side) of the projecting portions 45 and thereby the coolant in a wide range contributes to cooling the collector electrode block 40.

As shown in FIG. 5B, on a midstream side of the coolant (center side in the X direction of the semiconductor module 1), the heat of the semiconductor devices 3 can be discharged to a side of the cooler 10 via bumps B. In addition, on an upstream side and downstream side of the coolant (outsides in the X direction of the semiconductor module 1), the heat of the semiconductor devices 3 can be discharged to the cooler 10 side via the flat plate portion 44 and the pair of projecting portions 45. Thus, heat can be effectively discharged from both sides of the semiconductor devices 3. As a result, the four semiconductor devices 3 which are arranged between the pair of projecting portions 45 in a part below the flat plate portion 44 can be uniformly cooled. Thus, temperature variations for each of the semiconductor devices 3 can be prevented, thereby allowing an improvement in a cooling performance.

In addition, in the present embodiment, the through hole 46 penetrating in a thickness direction is formed in the center of the flat plate portion 44. According to this configuration, the through hole 46 can be used as an injection port for the sealing resin 5. This allows the sealing resin 5 to be uniformly filled with between the flat plate portion 44 and the semiconductor devices 3. Furthermore, voids formed when the sealing resin 5 is injected can be easily removed.

In addition, in the present embodiment, the gate electrodes 31 are arranged closer to a center side of the flat plate portion 44 than the emitter electrodes 32. That is, each of the gate electrodes 31 of the four semiconductor devices 3 is placed toward the center side of the flat plate portion 44 as shown in FIG. 3 and FIG. 4 and each of the emitter electrodes 32 is positioned on an outer peripheral side than the gate electrodes 31. More specifically, the four semiconductor devices 3 are provided in a 2×2 arrangement below the flat plate portion 44 in a plan view; and the gate electrodes 31 of the semiconductor devices 3 are arranged so as to face one another in the center of the flat plate portion 44. According to this configuration, the emitter electrodes 32 that are heat generation locations are not concentrated on the center side of the module and spacing between the emitter electrodes 32 is allowed. As a result, heat is dispersed without being concentrated on the center of the module, thereby, allowing cooling efficiency to be enhanced. Furthermore, each of the gate electrodes 31 is arranged on a center side of the laminated substrate 2 and is bonded to an upper surface of each of the ends of the branched H portion 24b via bumps B, which can make the wiring length from an outside to each of the gate electrodes 31 short and uniform and in addition, can prevent gate oscillation.

In addition, in the present embodiment, at an outside of the collector electrode block 40, the gate electrode block 41, the emitter electrode block 42, and the sense emitter electrode block 43 are arranged. That is, the collector electrode block 40 is arranged so as to be sandwiched between the gate electrode block 41, the emitter electrode block 42, and the sense emitter electrode block 43, in the Y direction. According to this configuration, the emitter electrode block 42 and the sense emitter electrode block 43 are arranged at the outside of the collector electrode block 40, thereby allowing external connection to be easily implemented.

Next, a semiconductor module manufacturing method according to one aspect of the present embodiment will be described with reference to FIG. 6 to FIG. 9. FIG. 6 to FIG. 9 are perspective views each showing one example of a step of the semiconductor module manufacturing method according to the present embodiment. Note that the semiconductor module manufacturing method presented below is merely an example and can be modified as appropriate without being limited to this configuration. In the following figures, the heat dissipating plate will be omitted for convenience of description. In addition, Figures A and B of FIGS. 6, 7, and 9 show states before and after each step.

A method for manufacturing the semiconductor module 1 according to the present embodiment includes the following steps which are performed in the given order: a preparation step of preparing a laminated substrate 2 and block electrodes 4; a chip arrangement step of arranging semiconductor devices 3 on a collector electrode block 40 (see FIG. 6); a first block electrode arrangement step of arranging a gate electrode block 41, an emitter electrode block 42, and a sense emitter electrode block 43 on the laminated substrate 2 (see FIG. 7); a bump arrangement step of arranging bumps on the semiconductor devices 3 (see FIG. 8); a second block electrode arrangement step of arranging the collector electrode block 40 and the semiconductor devices 3 on the laminated substrate 2 (see FIG. 9); and a sealing step of filling a sealing resin 5 (see FIG. 1). Note that the order of those steps can be changed as appropriate unless any contradiction occurs.

First, the laminated substrate 2 and the block electrodes 4 (collector electrode block 40, gate electrode block 41, emitter electrode block 42, and sense emitter electrode block 43) which are described above are prepared in advance (preparation step).

Figure 6A:
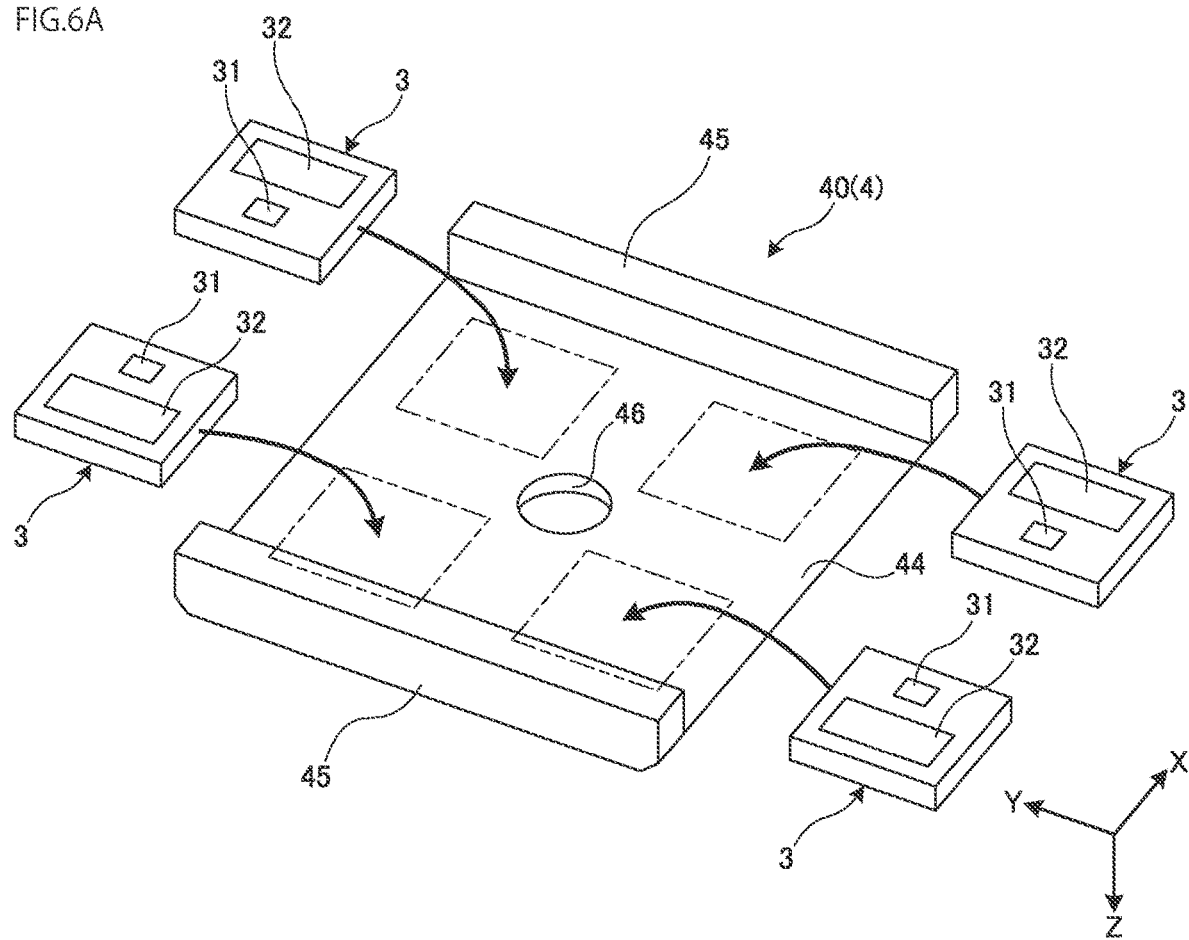
FIG. 6A and FIG. 6B are perspective views showing one example of a step of a semiconductor module manufacturing method according the present embodiment.
Figure 6B:
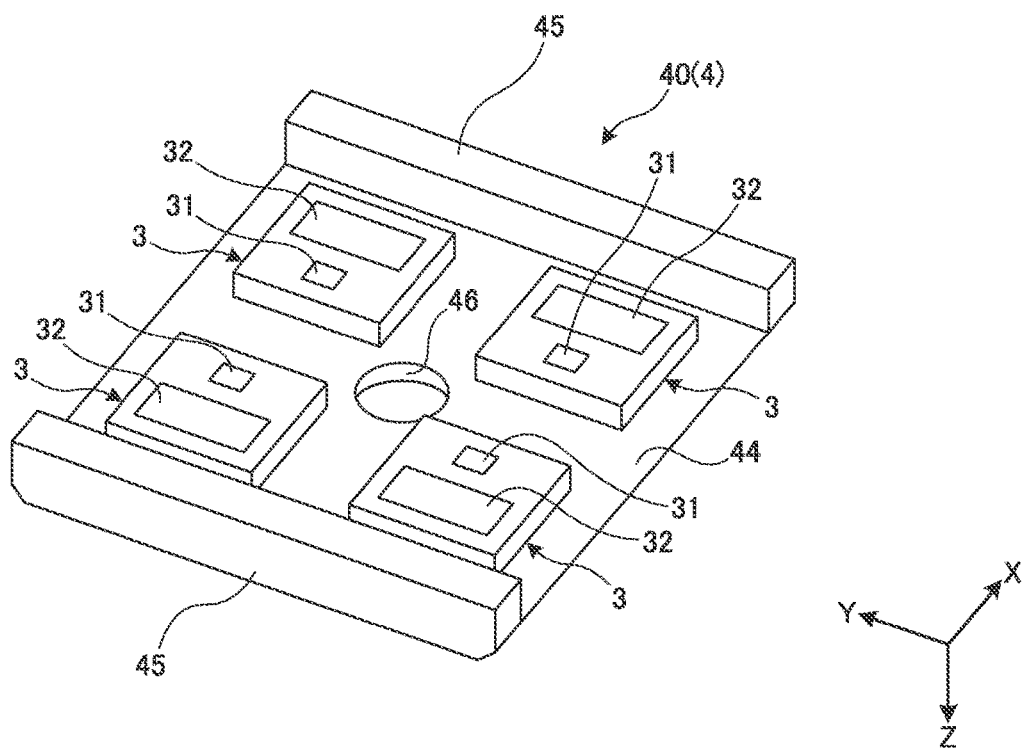

Next, the chip arrangement step is performed. As shown in FIG. 6A and FIG. 6B, in the chip arrangement step, four semiconductor devices 3 are arranged with collector electrodes 30 faced to a lower surface of the flat plate portion 44. On an upper surface (collector surface) of each of the semiconductor devices 3, a bonding material S (see FIG. 4) is placed, and the arrangement is performed at predetermined positions of the flat plate portion 44. In this case, a gate electrode 31 of each of the semiconductor devices 3 is arranged inward in the X direction relative to an emitter electrode 32. Then, the collector surfaces of the semiconductor devices 3 are pressed against the flat plate portion 44 at a predetermined pressure and are heated at a predetermined temperature for a predetermined time, and thereby the semiconductor devices 3 and the flat plate portion 44 are electrically bonded via the bonding material S. Note that as the bonding material S, one that is formed in advance in a sheet-like shape matched with the shape of the semiconductor devices 3 may be used; alternatively, a paste-like metal sintered material or the like may be applied to the collector surfaces.

Figure 7A:
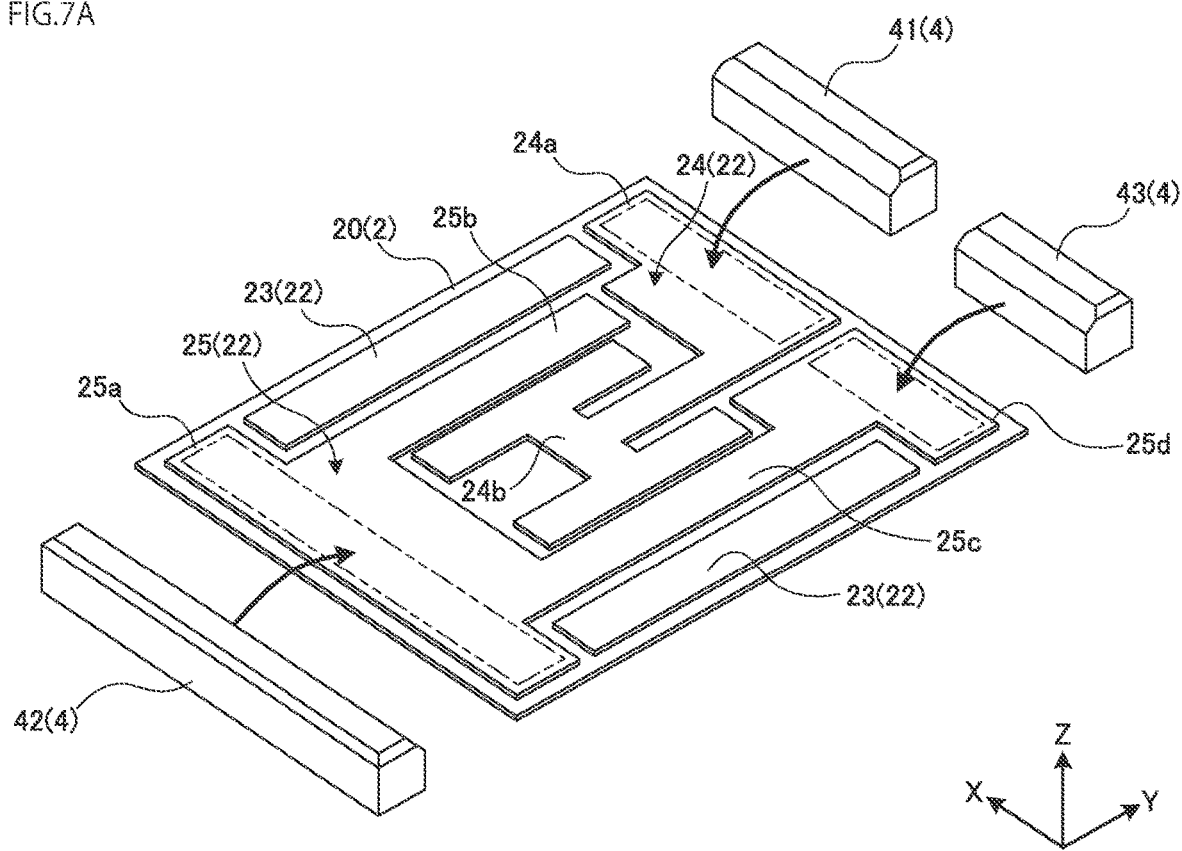
FIG. 7A and FIG. 7B are perspective views showing one example of a step of the semiconductor module manufacturing method according the present embodiment.
Figure 7B:
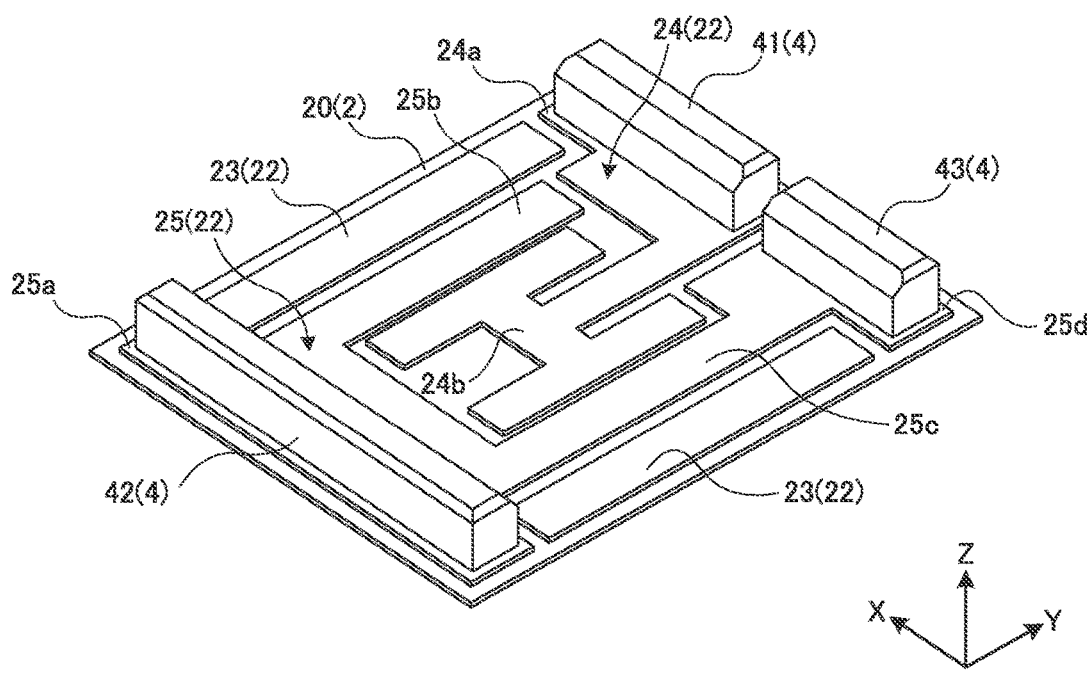

Next, the first block electrode arrangement step is performed. As shown in FIG. 7A and FIG. 7B, in the first block electrode arrangement step, the gate electrode block 41, the emitter electrode block 42, and the sense emitter electrode block 43 are arranged at predetermined positions on the circuit patterns 22. Specifically, the gate electrode block 41 is arranged on an upper surface of the L portion 24a via the bonding material S. The emitter electrode block 42 is arranged on an upper surface of the emitter portion 25a via the bonding material S. The sense emitter electrode block 43 is arranged on an upper surface of the sense emitter portion 25a via the bonding material S. Then, these block electrodes 4 are pressed against the laminated substrate 2 at a predetermined pressure and are heated at a predetermined temperature for a predetermined time and thereby, the circuit patterns 22 and the block electrodes 4 except the collector electrode block 40 are electrically bonded via the bonding material S.

Figure 8:
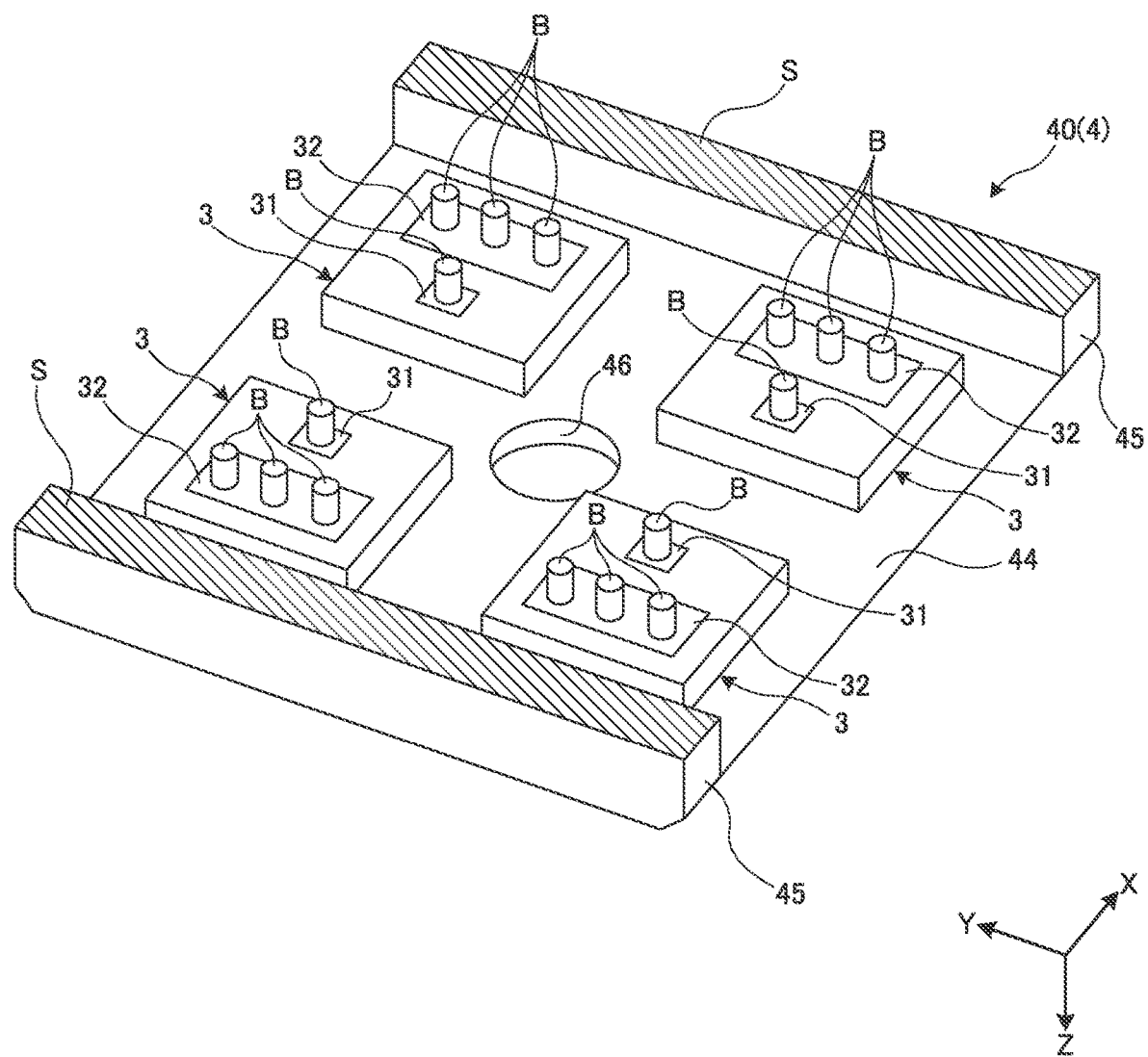
FIG. 8 is a perspective view showing one example of a step of the semiconductor module manufacturing method according the present embodiment.

Next, the bump arrangement step is performed. As shown in FIG. 8, in the bump arrangement step, bumps B of a predetermined height are arranged on the emitter electrodes 32 and the gate electrodes 31. In addition, the bonding material S is placed on the lower surfaces of the pair of projecting portions 45. Note that the bumps B preferably have such a height that the bumps project slightly more than lower surfaces of the bonding material S.

Figure 9A:
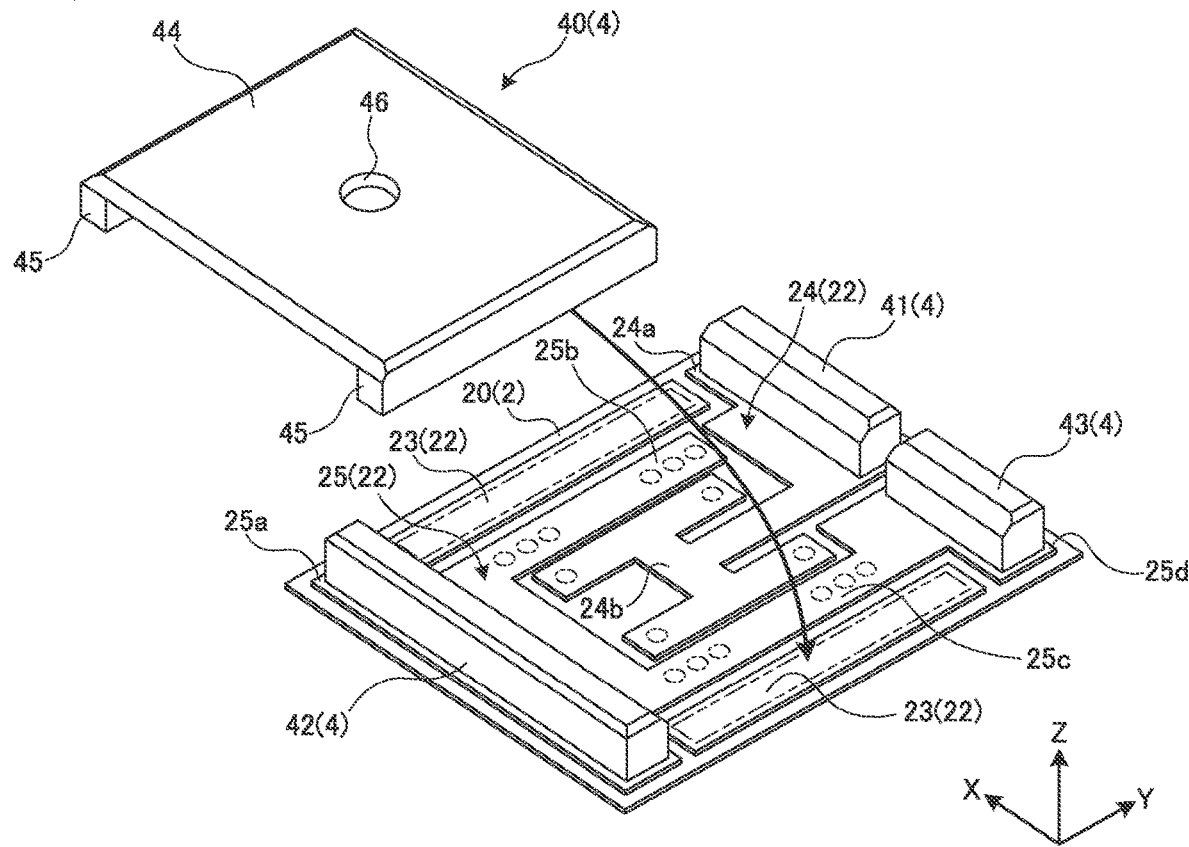
FIGS. 9A and 9B are perspective views showing one example of a step of the semiconductor module manufacturing method according the present embodiment.
Figure 9B:
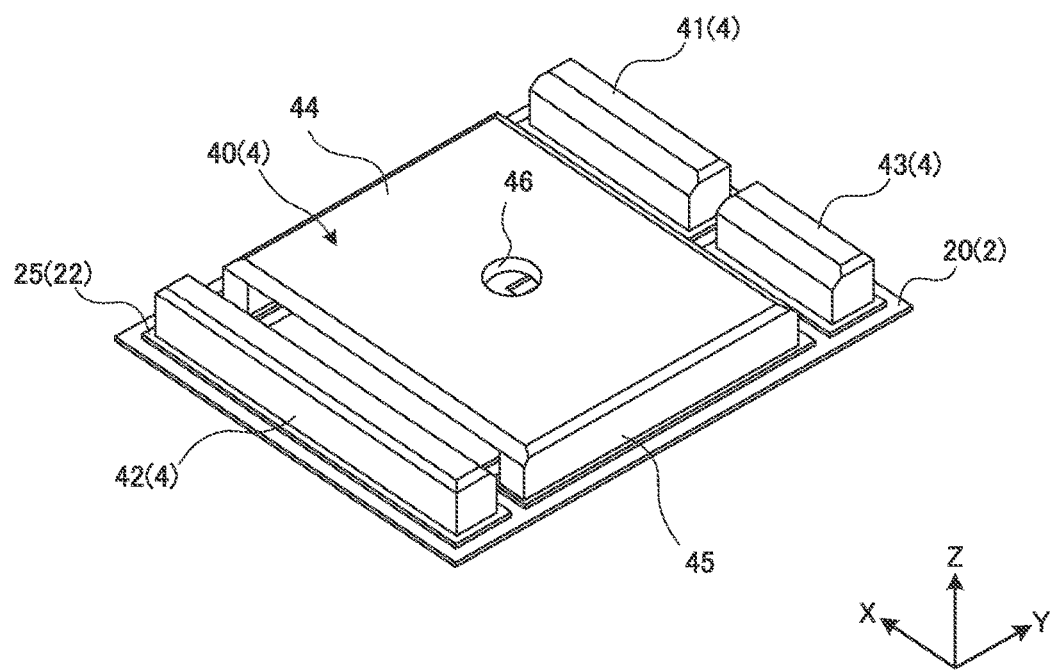

Next, the second block electrode arrangement step is performed. As shown in FIG. 9A and FIG. 9B, in the second block electrode arrangement step, the emitter electrodes 32 are bonded to a corresponding circuit pattern 22 via bumps B and the pair of projecting portions 45 are bonded to corresponding circuit patterns 22 via the bonding material S. Specifically, the bumps B placed on the emitter electrodes 32 are positioned on upper surfaces of the pair of the long portions 25b and 25c; and the bumps B placed on the gate electrodes 31 are positioned on an upper surface of the H portion 24b. In addition, the pair of projecting portions 45 is arranged on upper surfaces of the pair of collector circuit patterns 23 via the bonding material S. The collector electrode block 40 is pressurized against the laminated substrate 2 at a predetermined pressure and is heated for a predetermined time at a predetermined temperature; and thereby, the emitter electrodes 32 are bonded to their corresponding circuit pattern 22 via bumps B and the collector electrode block 40 is bonded to the collector circuit patterns 23 via the bonding material S.

Next, the sealing step is performed. As shown in FIG. 1, in the sealing step, a space above the laminated substrate 2 is sealed by the sealing resin 5. For example, a rectangular frame body (not illustrated) is arranged around the laminated substrate 2 and a space within the frame body can be uniformly filled with the sealing resin 5 from the through hole 46. The sealing resin 5 is hardened, thereby sealing the laminated substrate 2, the semiconductor devices 3, and the block electrodes 4. Thus, the integrated semiconductor module 1 is completed.

As described above, according to the present invention, a bonding direction of the semiconductor device 3 is reversed from conventional one and the emitter electrode 32 is arranged toward a side of the laminated substrate 2, thereby allowing a reduction in thermal resistance and a reduction in inductance. In addition, the configurations of wire and the like can be omitted in comparison with a prior art, allowing simplification and miniaturization of the configuration of the entire module.

In the above embodiment, the number and arrangement positions of the semiconductor devices 3 are not limited to the above configuration, and can be changed as appropriate.

In the above embodiment, the number and layout of the circuit patterns 22 are not limited to the above configuration, and can be changed as appropriate.

In the above embodiment, the laminated substrate 2 and the semiconductor devices 3 are formed in a rectangular shape or square shape in a plan view, however, this configuration is not limited thereto. The laminated substrate 2 and the semiconductor devices 3 may be formed into a polygonal shape other than the above.

Although the present embodiment and modifications have been described, the above-described embodiment and modifications may be combined in whole or in part as another embodiment.

The present embodiment is not limited to the above embodiment and modifications, and various changes, substitutions, and alterations may be made without departing from the spirit of the technical idea. Furthermore, if the technical idea can be implemented in other ways by technical advances or other techniques derived, the method may be used. Therefore, the claims cover all embodiments that can be included within the scope of the technical idea.

The characteristic points of the above embodiment will be described in summary below.

The semiconductor module described in the above embodiment is characterized by including: a laminated substrate including a circuit pattern arranged on an upper surface of an insulating plate and a heat dissipating plate arranged on a lower surface of the insulating plate; a semiconductor device that has a collector electrode arranged on an upper surface thereof, has an emitter electrode and a gate electrode arranged on a lower surface thereof, and has the emitter electrode and the gate electrode each bonded to an upper surface of the circuit pattern via a bump; and a block electrode that is bonded to the collector electrode. The block electrode includes: a flat plate portion that covers over the semiconductor device; and a pair of projecting portions that project from both ends of the flat plate portion toward the circuit pattern and is bonded to the circuit pattern.

The semiconductor module described in the above embodiment is further characterized in that a direction in which the pair of projecting portions face each other corresponds to a direction in which a coolant flows.

The semiconductor module described in the above embodiment is further characterized in that the semiconductor device is arranged between the pair of projecting portions.

The semiconductor module described in the above embodiment is further characterized in that a through hole is formed in the center of the flat plate portion.

The semiconductor module described in the above embodiment is further characterized in that the semiconductor device has a gate electrode arranged on the lower surface thereof and the gate electrode is arranged closer to a center side of the flat plate portion than the emitter electrode.

The semiconductor module described in the above embodiment is further characterized in that four pieces of the semiconductor devices are provided in a 2×2 arrangement below the flat plate portion in a plan view, and the gate electrodes of the semiconductor devices are arranged so as to face one another in the center of the flat plate portion.

The semiconductor module described in the above embodiment is further characterized in that: the circuit pattern includes a collector circuit pattern connected to the collector electrode, a gate circuit pattern connected to the gate electrode, and an emitter circuit pattern connected to the emitter electrode; the block electrode includes a collector electrode block bonded to the collector circuit pattern, a gate electrode block bonded to the gate circuit pattern, an emitter electrode block bonded to an emitter portion of the emitter circuit pattern, and a sense emitter electrode block bonded to a sense emitter portion of the emitter circuit pattern; and the collector electrode block is composed of the flat plate portion and the pair of projecting portions and outside the collector electrode block, the gate electrode block, the emitter electrode block, and the sense emitter electrode block are arranged.

The semiconductor module described in the above embodiment is further characterized in that: the gate circuit pattern has a region where the gate electrode is bonded via its corresponding bump, in the center of the insulating plate; and the emitter circuit pattern has a region where the emitter electrode is bonded via its corresponding bump, outside the gate circuit pattern.

The semiconductor module described in the above embodiment is further characterized in that: the gate circuit pattern is arranged in the center of the insulating plate and has an H portion of an H shape in a plan view, where the gate electrode is bonded to an upper surface of an end of branched H portion, via its corresponding bump; and the emitter circuit pattern has a pair of long portions that are arranged so as to face each other between the pair of projecting portions so that they sandwich the H portion, where the emitter electrode is bonded to the pair of long portions via their corresponding bumps.

The semiconductor module described in the above embodiment is further characterized in that the collector circuit pattern has long shapes corresponding to the pair of projecting portions and each of the pair of long portions is arranged between the H portion and the collector circuit pattern.

The semiconductor module described in the above embodiment is further characterized in that: the emitter circuit pattern includes an emitter portion that connects between one ends of the long portions in the pair and a sense emitter portion that is connected to one long portions of the pair of long portions; the emitter electrode block is bonded to an upper surface of the emitter portion; the sense emitter electrode block is bonded to an upper surface of the sense emitter portion; and the emitter electrode block and the sense emitter electrode block are arranged so as to sandwich the flat plate portion outside the flat plate portion in a plan view.

The semiconductor module described in the above embodiment is further characterized in that the gate electrode block faces the emitter electrode block across the flat plate portion and is arranged side by side with the sense emitter block.

In addition, the semiconductor module manufacturing method described in the above embodiment is characterized by performing: a preparation step of preparing a laminated substrate including a circuit pattern arranged on an upper surface of an insulating plate and a heat dissipating plate arranged on a lower surface of the insulating plate, and a block electrode including both a flat plate portion covering over a semiconductor device and a pair of projecting portions projecting from both ends of the flat plate portion toward the circuit pattern; a chip arrangement step of arranging the semiconductor device with a collector electrode thereof directed toward a lower surface of the flat plate portion; and a block electrode arrangement step of bonding, after the chip arrangement step, an emitter electrode arranged on a lower surface of the semiconductor device to the circuit pattern on the insulating plate via a bump and also bonding the pair of projecting portions to the circuit pattern.

The semiconductor module manufacturing method described in the above embodiment is further characterized in that a through hole is formed in the center of the flat plate portion and after the block electrode arrangement step, a sealing step of sealing the semiconductor device by filling a sealing resin from the through hole is performed.

INDUSTRIAL APPLICABILITY

As described above, the present invention has the effects of reducing thermal resistance and also reducing inductance; and is especially useful for a semiconductor module and a semiconductor module manufacturing method.

REFERENCE SIGNS LIST 1 semiconductor module
2 laminated substrate
3 semiconductor device 4 block electrode
5 sealing resin
10 cooler
10a fin
10b groove
20 insulating plate
21 heat dissipating plate
22 circuit pattern
23 collector circuit pattern
24 gate circuit pattern
24a L portion
24b H portion
25 emitter circuit pattern
25a emitter portion
25b long portion
25c long portion
25d sense emitter portion
30 collector electrode
31 gate electrode
32 emitter electrode
40 collector electrode block
41 gate electrode block
42 emitter electrode block
43 sense emitter electrode block
44 flat plate portion
45 projecting portion
46 through hole
B bump
F cooling direction (direction in which coolant flows)
S bonding material

What is claimed is:

1. A semiconductor module, comprising:
a laminated substrate including an insulating plate, a circuit pattern arranged on an upper surface of the insulating plate and a heat dissipating plate arranged on a lower surface of the insulating plate opposite to the upper surface of the insulating plate;
a semiconductor device having an upper surface and a lower surface opposite to the upper surface and facing the circuit pattern, the semiconductor device including a collector electrode arranged on the upper surface of the semiconductor device, and an emitter electrode and a gate electrode arranged on the lower surface of the semiconductor device, the emitter electrode and the gate electrode each being bonded to an upper surface of the circuit pattern via a bump; and
a block electrode including a collector electrode block bonded to the collector electrode and an other electrode block bonded to the circuit pattern outside the collector electrode block in a plan view of the semiconductor module, the collector electrode block including
a flat plate portion covering over the semiconductor device; and
a pair of projecting portions projecting toward the circuit pattern in a thickness direction orthogonal to a surface of the insulating plate from a respective one of both ends of the flat plate portion, and being bonded to the circuit pattern.

2. The semiconductor module according to claim 1, wherein each of the pair of projecting portions is arranged along a respective one of two opposing sides of the insulating plate.

3. The semiconductor module according to claim 1, wherein a direction in which the pair of projecting portions face each other is parallel to a direction in which a coolant flows.

4. The semiconductor module according claim 1, wherein the semiconductor device is arranged between the pair of projecting portions.

5. The semiconductor module according to claim 1, wherein the flat plate portion has a through hole at a center thereof.

6. The semiconductor module according to claim 1, wherein the gate electrode is arranged closer to a center of the flat plate portion than is the emitter electrode.

7. The semiconductor module according to claim 1, wherein the semiconductor device is formed in plurality that are four and are provided in a 2×2 arrangement below the flat plate portion in the plan view of the semiconductor module, and the gate electrode of each of the semiconductor devices is arranged so as to face one another at a center of the flat plate portion.

8. The semiconductor module according to claim 1, wherein the other electrode block is connected to the emitter electrode or the gate electrode via the circuit pattern.

9. A semiconductor module comprising:
a laminated substrate including an insulating plate, a circuit pattern arranged on an upper surface of the insulating plate and a heat dissipating plate arranged on a lower surface of the insulating plate opposite to the upper surface of the insulating plate;
a semiconductor device having an upper surface and a lower surface opposite to the upper surface and facing the circuit pattern, the semiconductor device including a collector electrode arranged on the upper surface of the semiconductor device, and an emitter electrode and a gate electrode arranged on the lower surface of the semiconductor device, the emitter electrode and the gate electrode each being bonded to an upper surface of the circuit pattern via a bump; and
a block electrode bonded to the collector electrode, the block electrode including
a flat plate portion covering over the semiconductor device; and
a pair of projecting portions projecting toward the circuit pattern in a thickness direction orthogonal to a surface of the insulating plate from a respective one of both ends of the flat plate portion, and being bonded to the circuit pattern, wherein the circuit pattern includes:
a collector circuit pattern connected to the collector electrode,
a gate circuit pattern connected to the gate electrode, and
an emitter circuit pattern connected to the emitter electrode, the emitter circuit pattern having an emitter portion and a sense emitter portion;
the block electrode includes a collector electrode block that is constituted of the flat plate portion and the pair of projecting portions, and is bonded to the collector circuit pattern, the block electrode further including:
a gate electrode block bonded to the gate circuit pattern,
an emitter electrode block bonded to the emitter portion of the emitter circuit pattern, and
a sense emitter electrode block bonded to the sense emitter portion of the emitter circuit pattern; and
the gate electrode block, the emitter electrode block, and the sense emitter electrode block are arranged outside the collector electrode block in a plan view of the semiconductor module.

10. The semiconductor module according to claim 9, wherein:

the gate circuit pattern has a region where the gate electrode is bonded via a corresponding bump at a center of the insulating plate; and the emitter circuit pattern has a region where the emitter electrode is bonded via a corresponding bump, outside the gate circuit pattern.

11. The semiconductor module according to claim 10, wherein:

the gate circuit pattern is arranged at the center of the insulating plate, and has an H portion having four branches forming an H shape in the plan view, the gate electrode being provided in plurality, each of the plurality of gate electrode being bonded to an upper surface of an end of each of the branches via its corresponding bump; and the emitter circuit pattern has a pair of long portions that are arranged so as to face each other between the pair of projecting portions so that the long portions sandwich the H portion in the plan view, the emitter electrode being bonded to the pair of long portions via their corresponding bump.

12. The semiconductor module according to claim 11, wherein:

the collector circuit pattern has a long shape corresponding to each of the pair of projecting portions; and each of the pair of long portions is arranged between the H portion and the collector circuit pattern.

13. The semiconductor module according to claim 12, wherein:

the emitter portion of the emitter circuit pattern connects one ends of the pair of long portions with each other;

the sense emitter portion of the emitter circuit pattern is connected to one long portion in the pair of long portions;

the emitter electrode block is bonded to an upper surface of the emitter portion;

the sense emitter electrode block is bonded to an upper surface of the sense emitter portion; and the emitter electrode block and the sense emitter electrode block are arranged so as to sandwich the flat plate portion outside the flat plate portion in the plan view.

14. The semiconductor module according to claim 13, wherein:

the gate electrode block faces the emitter electrode block across the flat plate portion and is arranged side by side with the sense emitter block.

15. A semiconductor module manufacturing method, comprising:

preparing a laminated substrate and a block electrode, the laminated substrate including an insulating plate, a circuit pattern arranged on an upper surface of the insulating plate, and a heat dissipating plate arranged on a lower surface of the insulating plate, the block electrode including a collector electrode block and an other electrode block, the collector electrode block including a flat plate portion covering over a semiconductor device and a pair of projecting portions projecting from both ends of the flat plate portion toward the circuit pattern;

arranging the semiconductor device such that a collector electrode of the semiconductor device is directed toward a lower surface of the flat plate portion; and after the arranging the semiconductor device, bonding an emitter electrode arranged on a lower surface of the semiconductor device to the circuit pattern on the insulating plate via a bump, bonding the pair of projecting portions to the circuit pattern, and bonding the other electrode block to the circuit pattern outside the collector electrode block in a plan view of the semiconductor module.

16. The semiconductor module manufacturing method according to claim 15, further comprising after the bonding the pair of projecting portions to the circuit pattern, sealing the semiconductor device by filling it a sealing resin via a through hole formed at a center of the flat plate portion.

17. The semiconductor module manufacturing method according to claim 15, further comprising bonding a gate electrode arranged on the lower surface of the semiconductor device to the circuit pattern on the insulating plate via a bump, wherein the bonding the other electrode block to the circuit pattern includes connecting the other electrode block to the emitter electrode or the gate electrode via the circuit pattern.

* * * * *